(12) United States Patent
Lautzenhiser et al.

(10) Patent No.: US 6,328,914 B1
(45) Date of Patent: Dec. 11, 2001

(54) THICK-FILM PASTE WITH INSOLUBLE ADDITIVE

(75) Inventors: Frans Peter Lautzenhiser, Noblesville; Carl William Berlin, West Lafayette; Bradley Howard Carter; Dwadasi Hare Rama Sarma, both of Kokomo; John Karl Isenberg, Rossville, all of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/240,084

(22) Filed: Jan. 29, 1999

(51) Int. Cl.$^7$ .................. H01B 1/06; H01C 1/06
(52) U.S. Cl. .................. 252/510; 252/500; 252/502; 252/511; 252/512; 252/513; 252/518.1; 338/22 R
(58) Field of Search .................. 252/500, 502, 252/511, 512, 513, 514, 518.1, 510; 335/22 R

(56) References Cited

U.S. PATENT DOCUMENTS 5,260,163 * 11/1993 Nebe et al. ............... 430/198
5,624,782 * 4/1997 Hayakawa et al. ........ 430/198

* cited by examiner

*Primary Examiner*—Yogendra N. Gupta
*Assistant Examiner*—Derrick G. Hamlin
(74) *Attorney, Agent, or Firm*—Jimmy L. Funke

(57) ABSTRACT

A thick-film paste for printing thick-film circuit elements, including solder stops, conductors, resistors and capacitors, and a method for using the paste. The paste has a composition that includes an organic vehicle, a filler material that contributes the desired electrical and/or material properties to the thick film fired from the paste, and an additive that is insoluble in the organic vehicle and contributes pseudoplastic Theological properties to the paste during printing. The additive also preferably evaporates, burns off, sublimates or is otherwise removed below the firing temperature of the paste.

14 Claims, 1 Drawing Sheet

THICK-FILM PASTE WITH INSOLUBLE ADDITIVE

FIELD OF THE INVENTION

The present invention generally relates to thick-film processes and materials. More particularly, this invention relates to a thick-film paste containing an additive that enables thick film circuit elements to be formed from the paste with reduced thicknesses while maintaining printing performance, including line definition.

BACKGROUND OF THE INVENTION

Hybrid microcircuits are characterized by microcircuit elements, e.g., conductors, resistors and capacitors, that are deposited as thick films on a substrate, such as ceramic. Thick films are typically about 0.5 mil (about 12.5 μm) or more in thickness, and often formed by screen printing a paste or ink composition that is then dried and fired. Thick-film pastes generally contain an organic vehicle in which is dispersed in an inorganic particulate filler, which is electrically conductive, resistive or dielectric, depending on the circuit element desired. The particulate filler is generally in the form of powdered solids, though in some cases the particulate filler may be dissolved, and becomes a solid during firing. Firing the thick-film paste serves to burn off the organic vehicle and sinter the particulate filler.

To obtain flow properties appropriate for screen printing, thick-film pastes typically contain about 35 to 45 volume percent powdered solids, with the balance being organic vehicle. Depending on the density of the powdered solids, this volume fraction may correspond to about 70 to 90 weight percent solids. Factors that affect the flow properties of a thick-film paste include solids content, the viscosity of the organic vehicle, and the shape and average size of the solid particles. Solids content is particularly critical for achieving a beneficial pseudoplastic property to the rheology of the paste, by which the paste exhibits a relatively high viscosity at low shear rates, and lower viscosities as the shear rate increases. If the solids fraction of the paste is increased significantly above an acceptable range, the paste becomes too viscous and elastic to print well. On the other hand, if the solids fraction is decreased significantly below this range, the paste is not sufficiently tacky and cohesive to print well.

Because most thick-film pastes have a similar solids loading, the dried film thickness of different pastes printed through a given screen will typically fall within a similar range, e.g., about 0.7 to 0.9 mils (about 18 to 23 micrometers) when printed through a 290 mesh screen. The fired film thickness of a paste is generally equal to the dried film thickness times a densification factor, which typically ranges from about 0.5 to 0.8. For some applications, minimizing the fired film thickness of a printed paste is beneficial. However, achieving a significant reduction in fired film thickness without negatively affecting print performance (e.g., line definition) of the paste can be difficult. If the solids fraction of a paste is decreased in order to permit printing of thinner films, the paste will be excessively fluid unless the organic vehicle is either modified or changed to compensate for the lower solids content. However, simply increasing the viscosity of the vehicle to compensate for the reduction of powder can also cause problems. If the organic vehicle lacks a significant elastic component to its rheology, the paste solids will tend to settle out and agglomerate. Increasing the viscosity sufficiently to prevent settling will result in a paste that is too viscous to print. Thixotropic additives that impart a significant elastic component to organic vehicles result in unstable rheology; after resting, the paste will be extremely stiff, but while the paste is being worked the viscosity and elasticity continuously drop as the organic structure breaks down.

An example of an application that is complicated by the circumstances described above is illustrated in FIG. 1, which shows a circuit component 10 electrically connected to a conductor 12 with a solder joint 14. Also shown is a solder stop 16 formed with a conventional dielectric paste. The function of the solder stop 16 is to render part of the surface of the conductor 12 unwettable by the molten solder that forms the solder joint 14 during reflow, and thus defines the solderable areas of the conductor pattern. The component 10 is also shown as being underfilled with an adhesive 18 to promote reliability. In such applications, it is important to minimize obstructions to the flow of the adhesive 18 during the underfill process. Obstruction of the underfill adhesive 18 can result in an incomplete fill under the component 10, which is difficult to detect and may result in an unreliable part. Therefore, it is desirable that the fired film thickness for the solder stop 16 is as thin as possible while still being sufficient to prevent wetting of the conductor 12 by the molten solder. Theoretically, a solder stop could be less than one micrometer thick and still prevent wetting of the conductor 12.

Another consideration of solder stop performance is that it should be printed with good definition, since failure to resolve the desired solderable surface on the conductor 12 would result in a non-functioning or unreliable component 10. Pastes which have sufficient solids loading to achieve the necessary definition typically contain 70 to 80 percent solids by weight, but result in a fired film thickness of about 7.5 to 15 micrometers using standard thick-film processes and tools. This is thicker than necessary for rendering the conductor surface unwettable, and therefore unnecessarily impedes the underfill adhesive 18 without offering functional benefits. Attempts to reduce fired film thickness with pastes having lower solids content have resulted in inadequate line definition.

Similar problems are encountered if attempting to reduce the fired film thickness of thick film conductors, resistors and capacitors. Accordingly, essentially all thick-film processes could benefit from a thick-film paste that can be printed to achieve a reduced thickness while maintaining printing performance, including line definition.

SUMMARY OF THE INVENTION

The present invention provides a thick-film paste for printing thick-film circuit elements, including solder stops, conductors, resistors and capacitors, and a method for using the paste. According to the invention, the paste has a composition that includes an organic vehicle, a filler material that contributes the desired electrical or other material properties to the thick film fired from the paste, and a particulate additive that is insoluble in the organic vehicle and therefore contributes pseudoplastic rheological properties to the paste during printing, similar to that observed with pastes containing only conventional inorganic particulate materials. The additive also preferably evaporates, burns off, sublimates or is otherwise removed from the paste at a temperature lower than the firing temperature of the paste, more preferably not higher than the burn-off temperature of the organic vehicle, and most preferably not higher than the temperature at that which the paste is dried prior to firing. Accordingly, a method for forming a thick-film circuit element with the paste of this invention preferably includes printing the paste, drying the paste such that the additive is removed, and then firing the paste to burn off the organic vehicle and sinter or fuse the filler material.

As a result of the presence of the additive in the paste during printing, desirable line definition can be achieved without an excessive volume fraction of the filler material. Because the additive is eliminated from the paste prior to the paste being completely fired, the additive does not increase the fired film thickness. Accordingly, the present invention provides a very low solids paste that simultaneously achieves the benefits of reduced film thickness and print performance.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 1:
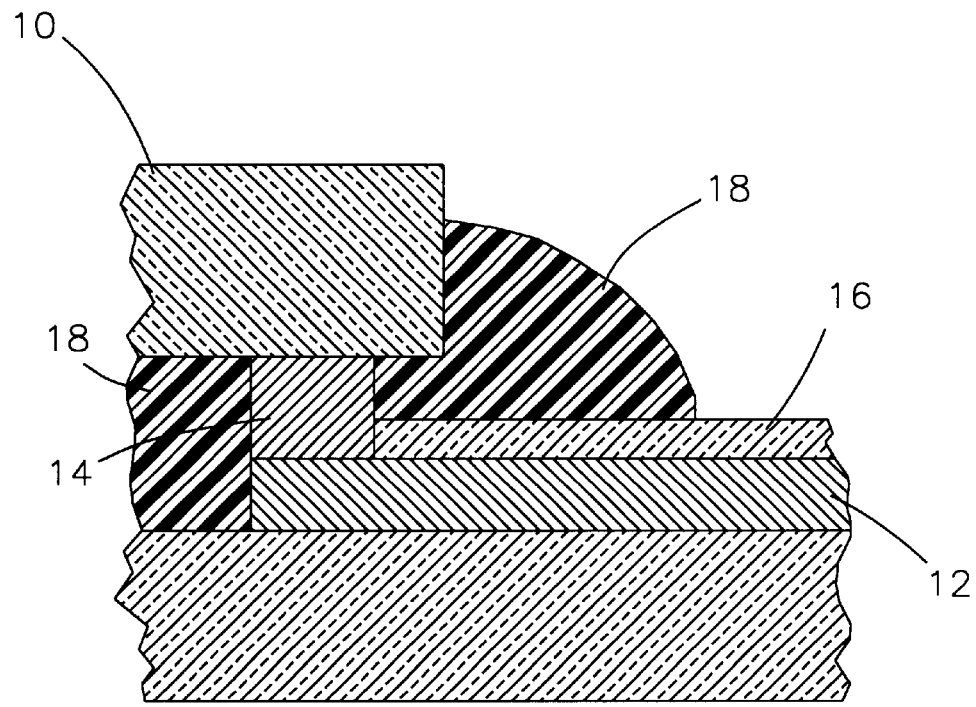
FIG. 1 is a cross-sectional view of a circuit structure with a solder stop in accordance with the prior art.
Figure 2:
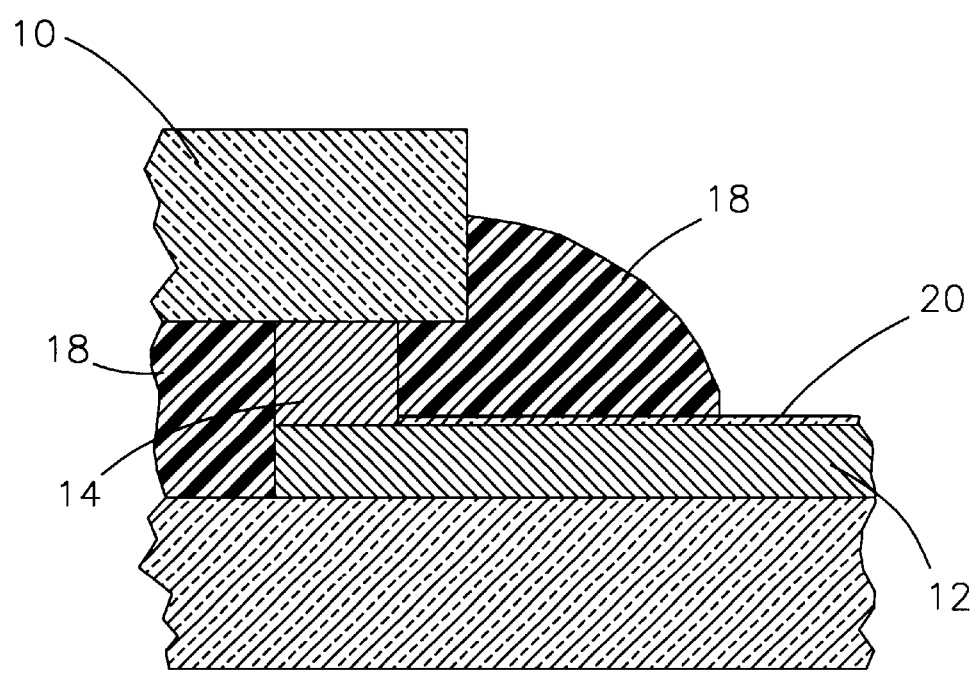
FIG. 2 is a cross-sectional view of a circuit structure with a solder stop printed with a very low solids dielectric paste in accordance with this invention.

According to this invention, a thick-film paste is provided that enables thick-film circuit elements to have reduced thicknesses after printing and firing, yet also achieve excellent line definition. An example of an application that benefits from the present invention is illustrated in FIG. 2, which shows the assembly of FIG. 1 with a solder stop 20 whose thickness is significantly less than the stop 16 of FIG. 1 as a result of being formed with a dielectric paste having a very low solids content after firing, preferably on the order of about 3 to 15 weight percent solids. The solder stop 20 formed with the low-solids paste of this invention can be less than one micrometer thick, yet is adequate to stop the molten solder from wetting the conductor 12 while also providing less obstruction to the underfill adhesive 18 during the underfill process.

The paste of this invention is able to achieve the above benefits by having a composition with a sufficient or even relatively high solids content during printing to promote print performance, and yet leave only a small amount of material after firing to reduce film thickness. As a result, the paste of this invention can be used in the application illustrated in FIG. 2 to yield a thin solder stop 20 with more nearly optimal dimensions and uniformity. An optimal solids content can be determined by consideration of the screen used to print the paste and the type of solids used.

Thick-film pastes in accordance with this invention generally contain an organic vehicle, a filler material that contributes the desired electrical or other material properties to the thick film fired from the paste, and a particulate additive that is insoluble in the organic vehicle and therefore contributes pseudoplastic rheological properties to the paste during printing. Preferred filler materials for the thick-film paste of this invention are inorganic particulate fillers, as discussed in greater detail below. Alternatively, all or part of the filler material may be an organometallic compound or other material that is dissolved in the paste, but then becomes a solid upon firing. Examples of organometallic compounds that can be used in this invention include solutions of resinates of silicon, bismuth, lead and ruthenium, and are commercially available from sources such as Englehard Industries. Organometallics offer the benefit of being workable without risk of agglomeration.

In a preferred embodiment of this invention, at least some and preferably all of the filler material is an inorganic particulate filler, such that both the filler and the additive are insoluble and dispersed in the organic vehicle, and therefore remain in a solid state to contribute pseudoplastic characteristics to the paste during printing. For this reason, preferred materials for the additive will depend on the organic vehicle used. Accordingly, the description of the additive will follow a discussion of suitable organic vehicle compositions and constituents.

As is conventional for thick-film materials known in the art, the organic vehicle generally contains binders, solvents, thinners and surfactants. According to the invention, the organic vehicle constitutes about 20 to about 60 weight percent of the entire paste composition. Preferred amounts of an organic vehicle in the paste will depend in part on the particular composition of the vehicle. According to the invention, the organic vehicle contains one or more binders in amounts of about 1 to about 5 weight percent of the paste. Ethyl cellulose is widely used as a binder in organic vehicles for thick-film paste compositions. Those having a viscosity type in the range of about 50 to about 200 per ASTM D914 are particularly preferred ingredients for the paste of this invention to obtain a viscosity that is appropriate for printing techniques, such as stencil or screen printing. A suitable commercial ethyl cellulose product is available from Hercules Incorporated under the name N50, and is used in amounts of about 4 to about 10 weight percent of the organic vehicle, and more preferably about 5 weight percent of the organic vehicle. It is foreseeable with this invention that other binders could be used for the organic vehicle, alone or in combination with ethyl cellulose.

The organic vehicle also contains one or more thinners/solvents in order to appropriately dissolve the binder. Examples of suitable thinners and solvents include terpineol, texanol, dibutyl carbitol, and dodecyl alcohol, the last of which also serves as a screen lubricant. The total solvent content in the organic vehicle is preferably about 85 to about 95 weight percent. In a preferred embodiment, two or more solvents are present to prevent the paste from cracking during drying.

The remainder of the organic vehicle preferably includes a surfactant, a suitable example of which is nonylphenol ethoxylated polyethylene glycol, preferably present in the organic vehicle in amounts of about 1 to about 6 weight percent, and more preferably about 3 weight percent. A suitable commercial example of this surfactant is available from Ashland Chemical Company of Columbus, Ohio, under the name Igepal CO-430.

In addition to the above, it is foreseeable that the organic vehicle of this invention may include other constituents, such as screening agents which, in addition to serving as a binder, may contribute to the desired paste-like consistency of the paste for the printing operation.

As understood by those skilled in the art, the composition of the filler material will depend on the particular application for the paste. If an inorganic particulate material, the filler material generally constitutes about 0.1 (or foreseeably even less) to about 75 weight percent of the paste, more preferably about 3 to 15 weight percent, with a preferred particle size of about 0.1 to 5 micrometers. If the paste is to form a thick-film conductor, the inorganic filler generally includes an electrically-conductive particulate material, such as gold, silver, palladium-silver alloys, platinum, copper, nickel and other traditional thick-film conductive materials. For thick-film capacitors, the inorganic filler is a high-dielectric constant (high $\epsilon_r$) material such as $BaTiO_3$ or perovskites. If used to form a thick-film resistor, the inorganic filler generally includes an electrically-resistive glass frit material, an electrically-conductive material such as iridium dioxide ($IrO_2$), ruthenium dioxide ($RuO_2$) or a ruthenate, and various additives used to favorably affect the final electrical properties of the resistor. Lastly, if used to form the solder stop of FIG. 2, the inorganic filler is generally a mixture of dielectric materials that includes glass frits and ceramic powders such as alumina. Suitable glass frit compositions may include any one or more of the following: litharge (PbO; also known as lead oxide, yellow and lead monoxide), boric acid ($H_3BO_3$) which serves as a source for boron oxide ($B_2O_3$), silicon dioxide ($SiO_2$), aluminum oxide ($Al_2O_3$), titanium dioxide ($TiO_2$), cupric oxide (CuO), and manganese oxide ($MnO_2$) or manganese carbonate ($MnCO_3$) as a source for manganese oxide.

The above-noted materials are merely set forth as examples, as the filler material can be essentially any material that achieves the electrical properties desired for the thick film, is soluble in the organic vehicle, and is compatible with the remaining constituents of the paste. It is again worth noting that all or a portion of the filler material may be an organometallic compound or other material that is dissolved in the paste, but then yields a suitable conductive, resistive or dielectric solid upon firing.

Finally, and as noted above, the additive of this invention must be insoluble in the organic vehicle so as to remain in a solid state in the paste and contribute desirable pseudoplastic characteristics during printing. Desirable pseudoplastic characteristics and printing performance are obtained if the additive is in particulate form, with a preferred particle size being about 0.5 to about 5 micrometers. Other desirable characteristics for the additive include a melting point below the firing temperature of the paste, and preferably a high vapor pressure in the solid state so that the material typically sublimates at or near temperatures suitable for drying the paste. Another desirable characteristic for the additive is the ability to be safely handled and disposed. It is foreseeable that a number of materials are suitable as the additive when used in combination with the organic vehicle compositions and solvents discussed above. However, preferred materials for the additive of this invention are generally polar organic materials that are insoluble in solvent-based screening agents. Examples of such materials are nicotinic acid (niacin), ammonium bicarbonate, and pentaerythritol. Nicotinic acid is particularly notable for readily meeting each of the above desired characteristics for the additive by being insoluble in organic vehicles having any combination of the above-named constituents, having a melting point (about 236° C.) well below typical paste firing temperatures (e.g., peak temperatures of about 850° C.), and having the ability to sublimate at temperatures below its melting point. In addition, the vapor pressure of nicotinic acid while in the solid state is sufficiently high to cause sublimation at temperatures suitable for drying the paste.

The amount of additive present in the paste should be at least about 5 weight percent to have a significant effect on printing characteristics. Optimum and maximum amounts of additive that may be used will depend on the solids content required to yield the desired printing characteristics for the particular thick film. If nicotinic acid is used as the additive, a suitable range is about 5 to 40 weight percent of the paste.

During an investigation leading to this invention, a thin solder stop similar to that shown in FIG. 2 was printed from a very low solids dielectric formulation having the following composition.

| CONSTITUENT | WEIGHT % |
|---|---|
| Solids (dielectric) | 15% |
| Nicotinic acid | 33 |
| Organic Vehicle: | |
| Terpineol (solvent) | 36 |
| Texanol (solvent) | 8 |
| N50 ethyl cellulose (binder) | 4 |
| Igepal CO-430 (surfactant) | 2 |
| Dodecyl alcohol (solvent) | 2 |

The dielectric solids was lead borosilicate glass frit, and was characterized by a particle size range of about 0.1 to about 5 micrometers. On the basis of the above, the organic vehicle constituted about 52 weight percent of the paste, and the solvents, binder and surfactant accounted for about 88, 8 and 4 weight percent, respectively, of the organic vehicle. The paste was printed with a 290 mesh screen on a conductor to a dried film thickness of about ten micrometers, and achieved excellent line definition in the process. On firing, the paste yielded a thick-film solder stop having a thickness of less than one micrometer while maintaining the excellent line definition achieved during printing. Such a thin solder stop reduced interference with underfilling of a component subsequently soldered to the conductor.

On the basis of the above, it was concluded that, due to a high fraction volume of particulate filler present during printing, thick-film pastes in accordance with this invention have a desirable pseudoplastic property that is beneficial to screen printing thick films of low fired film thickness without sacrificing excellent line definition, e.g., line widths of as little as three mils (about 75 micrometers) can be printed and maintained.

While the invention has been described in terms of a preferred embodiment, it is apparent that other forms could be adopted by one skilled in the art. Accordingly, the scope of the invention is to be limited only by the following claims.

What is claimed is:

1. A thick-film paste comprising:
   an organic vehicle;
   a filler material; and organic particulate
   an additive that is insoluble in the organic vehicle;
   wherein the thick-film paste is characterized by a firing temperature at which the organic vehicle burns off and the filler material fuses to form a film, and
   wherein the additive is characterized by a removal temperature at which the additive evaporates, sublimes or burns off so as to be removed from the thick-film paste, the removal temperature being lower than the firing temperature of the thick-film paste.

2. A thick-film paste as recited in claim 1, wherein the thick-film paste is characterized by a drying temperature at which the thick-film paste dries to form a solid but below the firing temperature of the thick-film paste, and wherein the removal temperature of the additive is not higher than the drying temperature.

3. A thick-film paste as recited in claim 1, wherein the additive is an organic particulate material and the filler material is an inorganic particulate material.

4. A thick-film paste as recited in claim 1, wherein the filler material comprises at least one constituent chosen from the group consisting of electrically-conductive materials, electrically-resistive materials, dielectric materials and organometallic compounds.

5. A thick-film paste as recited in claim 1, wherein the additive constitutes about 5 to about 40 weight percent of the thick-film paste.

6. A thick-film paste as recited in claim 1, wherein the filler material constitutes up to about 75 weight percent of the thick-film paste.

7. A thick-film paste as recited in claim 1, wherein the organic vehicle constitutes about 20 to about 60 weight percent of the thick-film paste.

8. A thick-film paste as recited in claim 1, wherein the thick-film paste consists essentially of about 20 to about 60 weight percent of the organic vehicle, about 3 to about 15 weight percent of the filler material, and about 5 to about 40 weight percent of the additive, wherein the additive is an organic particulate material having a particle size of about 0.5 to about 5 micrometers, and the filler material is an inorganic particulate material having a particle size of about 0.1 to about 5 micrometers.

9. A thick-film paste as recited in claim 1, wherein the additive is nicotinic acid.

10. A thick-film paste as recited in claim 1, wherein the thick-film paste is on a circuit board.

11. A thick-film paste comprising:
an organic vehicle;
a filler material; and
a polar organic particulate additive that is insoluble in the organic vehicle;
wherein the thick-film paste is characterized by a firing temperature at which the organic vehicle burns off and the filler material fuses to form a film, and wherein the polar organic particulate additive is characterized by a removal temperature at which the polar organic particulate additive evaporates, sublimates or burns off so as to be removed from the thick-film paste, the removal temperature being lower than the firing temperature of the thick-film paste.

12. A thick-film paste as recited in claim 11, wherein the thick-film paste is characterized by a drying temperature at which the thick-film paste dries to form a solid but below the firing temperature of the thick-film paste, and wherein the removal temperature of the polar organic particulate additive is not higher than the drying temperature.

13. A thick-film paste as recited in claim 11, wherein the polar organic particulate additive is chosen from the group consisting of ammonium bicarbonate, pentaerythritol and nicotinic acid.

14. A thick-film paste as recited in claim 11, wherein the polar organic particulate additive is nicotinic acid.

* * * * *